United States Patent [19]
Jewell et al.

[11] Patent Number: 5,315,629
[45] Date of Patent: May 24, 1994

[54] RINGFIELD LITHOGRAPHY

[75] Inventors: Tanya E. Jewell, Bridgewater, N.J.;
Kevin Thompson, La Canada, Calif.

[73] Assignee: AT&T Bell Laboratories, Murray Hill, N.J.

[21] Appl. No.: 732,559

[22] Filed: Jul. 19, 1991

Related U.S. Application Data

[63] Continuation-in-part of Ser. No. 595,341, Oct. 10, 1990.

[51] Int. Cl.⁵ .............................................. G21K 5/00
[52] U.S. Cl. ........................................ 378/34; 378/85
[58] Field of Search ................................... 378/34, 85

[56] References Cited

U.S. PATENT DOCUMENTS

| | | |
|---|---|---|
| 3,748,015 | 7/1973 | Offner . |
| 4,240,707 | 12/1980 | Wetherel et al. . |
| 4,733,955 | 3/1988 | Cook . |
| 4,747,678 | 5/1988 | Shafer . |
| 5,063,586 | 11/1991 | Jewell et al. ............... 378/34 |
| 5,153,898 | 10/1992 | Suzuki et al. ............... 378/34 |

OTHER PUBLICATIONS

*J. Vac. Sci. Technology*, Kinoshita et al., "Soft X-Ray Reduction Lithography Using Multilayer Mirrors", vol. B6, p. 1648 (1989).
*J. Vac. Sci. Technology*, Hawryluk and Seppala, "Soft X-Ray Projection Using an X-Ray Reduction Camera", vol. B6, p. 2161 (1988).
*Proc. of 33rd Int. Symp. on Electron, Ion, and Photon Beams*, Wood et al., "Short Wavelength Annular-Field Optical Systems for Imaging Tenth Micron Features", (1989).
*J. Vac. Sci. Technology*, Bjorkholm et al., "Reduction Imaging at 14 nm Using Multilayer Coated Optics: Printing of Features Smaller Than 0.1 mm", B8 (6), (Nov./Dec. 1990).
*Proceedings of SPIE*, "Resist Schemes for Soft X-Ray Lithography", vol. 1343, (1990).
*Solid State Technology*, D. L. White et al., "Soft X-Ray Projection Lithography", (Jul. 1991).

*Primary Examiner*—Craig E. Church
*Attorney, Agent, or Firm*—George S. Indig

[57] ABSTRACT

Ringfield projection apparatus using x-ray radiation e.g. of 1.30 Å wavelength is suitable for lithographic patterning in the fabrication of integrated circuits at design rules of 0.25 μm and below. The design permits reduction from an enlarged mask as well as substantial throughput, the latter due to unexpectedly large slit width. Incorporation of a folding mirror improves fabrication expediency by moving the device being fabricated to the other side of the system from the mask.

2 Claims, 3 Drawing Sheets

RINGFIELD LITHOGRAPHY

This is a continuation-in-part of our pending application Ser. No. 595,341, dated Oct. 10, 1990.

BACKGROUND OF THE INVENTION

1. Technical Field

The invention relates to ringfield projection pattern delineation expediently used in the fabrication of devices, e.g. integrated circuits, using submicron design rules, as well as to apparatus of such design as to serve in such fabrication. Utilization of reflective optics facilitates operation within the x-ray spectrum—in particular, at "long" wavelengths at and below 300 Å down to tens of Å. A variety of design features are of particular consequence. Throughput capability in such fabrication results from lens design permitting substantial width as well as substantial straight line length of the scanning ringfield slit—factors resulting also in the ability to pattern delineate otherwise desired large dimensioned LSI chips within a single scan sequence. Fabrication of Very Large Scale Integrated devices—electronic as well as optical and hybrid—built to design rules of 0.25 μm and below is contemplated.

2. Description of the Prior Art

The saga of Large Scale Integration from inception to the present time is well known. Evolution of the present 1-2 megabit chip built to design rules at or slightly below 1 μm does not represent the ultimate product. Lithographic definition has played, and will continue to play, a significant role. Fabrication of state-of-the-art devices depend on use of near-ultraviolet wavelength (e.g. of $\lambda = 3650$ Å). Intensive development effort is based on next generation devices which use shorter wavelength—or "deep UV" (e.g. of $\lambda = 2480$ Å). Still smaller design rules will likely dictate use of shorter wavelengths, and it is expected that electromagnetic radiation used for patterning will necessarily be in the x-ray spectrum.

R&D activity concerned with x-ray fabrication of future generation devices has concentrated on x-ray wavelengths of $\lambda = 10$–15 Å. Considerations relating to characteristics of materials—poor reflectance, transmission/absorption—are all considered to preclude useful optics. In consequence, this x-ray effort has been largely directed to "proximity printing"—effectively contact printing with small separation to protect fragile masks—an approach necessarily limited to 1:1 object-to-image size ratio.

Despite the above problems, a number of considerations support a continuing parallel effort directed to projection X-ray lithography. The effort is largely due to hopes for object-to-image reduction. Fabricating of 1:1 masks, particularly at or below 0.25 μm design rules, presents problems while enlarged masks of high integrity, suitable for use in reduction systems, may be made using present technology. In addition, thick, robust reflective masks, precluded in proximity printing, may be used in projection.

Early efforts on projection x-ray lithography used the two spherical mirror Schwarzschild system. (See, "Soft x-ray Reduction Lithography Using Multilayer Mirrors" by Kinoshita, et al, *J. Vac. Sci. Technol.*, vol. B6, p. 1648 (1989) and "Soft X-ray Projection Lithography Using an X-ray Reduction Camera" by Hawryluk and Seppala, *J. Vac. Sci. Technol.*, vol. B6, p. 2161 (1988).) There are three primary factors which restrict the use of a Schwarzschild design for practical lithography-field curvature, difficulty in achieving telecentricity, and degradation due to central obscuration.

Promising work concerns use of ringfield scanning systems. All ringfield optical forms are based on radial dependence of aberration and use the technique of balancing low order aberrations (i.e. third order) with higher order aberrations to create narrow annular regions of correction away from the optical axis of the system (regions of constant radius, rotationally symmetric with respect to the axis). The shape of the corrected region is, in consequence, an arcuate strip rather than a straight strip. Strip width is a function of the smallest feature to be printed with increasing residual astigmatism at distances greater or smaller than the design radius being of greater consequence for greater resolution.

A relevant apparatus based on this principle, but for use at longer wavelengths, is the Offner 1:1 ringfield system marketed by Perkin-Elmer Corporation. Useful description is included in the disclosure of U.S. Pat. No. 3,748,015, issued Jul. 24, 1973. It is a zero distortion, telecentric system used at unit magnification. Because of the symmetry of this system (here we refer to the fact that the optical system and beam paths are effectively identical from the object to the stop as they are from the stop to the image—the "stop" refers to the point of crossover of principal rays, or the position in the system at which the aperture is generally placed) coma and distortion are intrinsically corrected. Balancing of low and high order astigmatism provides a narrow circular region of correction. A significant advantage of the Offner 1:1 system is that the ringfield correction is achieved with spherical mirrors. Disadvantages of this system are that it has no reduction, and throughput is limited by the small ring width corresponding with the narrowness of the corrected zone.

As noted, a primary motivation toward x-ray projection lithography is the difficulty in 1:1 mask fabrication as required both in proximity printing and in the Offner ringfield system. Relevant disclosures describing systems using all-reflective three element objectives, are included in U.S. Pat. No. 4,240,707, issued Dec. 23, 1980, and U.S. Pat. No. 4,733,955, issued Mar. 29, 1988. Both these designs are based on configurations which comprise a negative (concave) mirror interposed between two positive (convex) ones, and both are designed for the visible/IR part of the spectrum. These systems are well suited for imaging distant objects (at infinity) over either two dimensional or high aspect ratio (straight slits) fields of view. However, neither of these systems is telecentric in the image space nor is corrected for image distortion. Another disadvantage of three-mirror designs for the purpose at hand is that both object and image are located on the same side of the system. The result is severe restriction in wafer motion to avoid obstruction of the optical system.

Another relevant disclosure is included in U.S. Pat. No. 4,747,678 issued May 31, 1988. It describes a 4:1 reduction optical system for deep UV lithography, which uses a combination of a four mirror reflective system and three groups of refractive lens systems. This is a ringfield system; it is telecentric and has low distortion. The fundamental concept in this design is that the refractive lenses allow for use of spherical mirrors in reduction configuration. This system achieves 0.5 μm resolution at 2500 Å wavelength, but is not suitable for the soft x-ray wavelength region due to significant absorption by the refractive lenses, leading, in turn, to concentration on reflective lenses.

Despite the inherent advantages of the 1:1 ringfield approach as used in the scanning mode, there is little confidence that it will play a valuable role in LSI fabrication. Aside from the 1:1 mask fabrication problem, the general belief is that throughput of such a scanning system is inherently small due to extreme demands placed on minimization of aberrations across the width of the ringfield. Consequent narrow ring-shape slit results in very low throughput.

In a reduction form of a ringfield system, coma and distortion are no longer cancelled by the symmetry of the configuration. As a result, more design variables are required for the control of these aberrations in addition to spherical aberration, astigmatism and field curvature. In the design described in U.S. Pat. No. 4,747,678, the variables take form of additional refractive lenses. For the x-ray designs the additional variables are in the form of aspheric departures of each mirror from a sphere. Aspheric coefficients for third order aberration correction (often called conic constants) and for higher order correction are very effective means for controlling aberrations and, generally, each coefficient can control or correct one order of one aberration term. The use of aspheric mirrors is currently thought to be inevitable for projection x-ray system. All-spherical mirror designs, promising from the standpoint of aberration correction, have been developed, but these systems involve up to ten mirrors. Poor reflectivities of soft x-rays at near-normal incidence—~60% for available multilayer mirrors—is well below the reflectivity of optical-/UV wavelengths (typically 98% and higher) and this imposes a severe restriction on a number of mirrors which can be used in the projection system.

Other difficulties are perhaps of still greater consequence. The 10–15 Å wavelength x-ray radiation used in proximity printing is outside the range of presently available x-ray optics as discussed above.

This has led to consideration of longer wavelength radiation-in the range centering about 130 Å, e.g. in the range of 100–150 Å. While suitable materials of somewhat larger refractive index values at such longer wavelengths are available, limitation on throughput based on slit width, W—a limitation related, not to radiation wavelength, but to device design rules continues to be a problem. (See, Wood, et al, *Proc. of 33rd Int. Symp. on Electron, Ion, and Photon Beams,* "Short Wavelength Annular-field Optical Systems for Imaging Tenth Micron Features", (1989).)

Available refractive indices at ~100 Å, while still quite low, are sufficient to permit fabrication of multilayered reflective optics ("Distributed Bragg Reflectors"). DBR reflective optics resulting in ~45% reflectance for use with 140 Å radiation have been constructed and used to obtain one-tenth $\mu$m feature sizes. See, Bjorkholm et al, "Reduction Imaging at 14 nm Using Multilayer Coated Optics: Printing of Features Smaller than 0.1 $\mu$m", *J. Vac. Sci. Technol.,* B8 (6) (November/December 1990). This approach, providing for full feature (non-scanning), reduction projection is severely limited by field curvature. While needed resolution is obtainable, field size is very small, e.g. 25 $\mu$m × 50 $\mu$m for feature size of 0.1 $\mu$m. While adaptable for use in ring-field scanning, the same field limit applies to result in a slit width W, of the order of a few microns (corresponding with a slit length, L, of the desired several mm).

In short, the lure of ring-field projection printing e.g. for 0.25 $\mu$m and below due to considerations such as mask safety and possibility of object-to-image reduction, has not yielded to feasible processing. Very high camera/source costs, due to throughput limitations, are considered responsible.

SUMMARY OF THE INVENTION

From the processing standpoint, the essence of the invention is the observation of ringfield projection properties to result in increased throughput of devices in fabrication while retaining the excellence associated with this approach. A major aspect of the invention concerns the attainability of slit dimensions which both accommodate image width during single scan while permitting large scan area. A particularly profound observation is in the fact that certain principle aberrations are of opposite slope in terms of dependence on radius from the optical center. This in turn permits design of optics to result in substantial cancellation of the aberrations, thereby permitting increased slit width, W, while permitting slit length L at least equal to a single pattern overall dimension.

Activity directed toward x-ray ringfield fabrication has been impeded by expected costs. Extrapolation from considerations implicit in the work described above leads to very low device throughput—leads to ineffective use of large apparatus investment. Useful production rates for the Perkin-Elmer apparatus approach are in large part due to acceptable scan rates, which, in turn, are the consequence of large slit width (characteristically ~2 mm). Required aberration limits across the slit width (to either side of the included arc of constant radial distance upon which the design is based) becomes limiting for smaller design rules. As a rough approximation reduction of design rules, form 1.0 $\mu$m to the presently contemplated 0.1 $\mu$m, results in a needed concomitant reduction in width (to ~0.1 mm or 100 $\mu$m). Other work suggests need for still narrower slits. Practical difficulty in illumination of consequent high aspect ratio slits is of particular consequence for relatively expensive x-ray sources. Further, since slit width for given aberration must be decreased with increasing radius to maintain aberration control, practical considerations lead to limitation on the radius. Lessening radius, however, also lessens the available straight line dimension of the slit arc. Consequences are of concern—consequent reduction of the scan area increases overhead (time required to reposition the apparatus in between scans)—permitted scan lengths may be reduced to less than desired image pattern widths, so requiring an extremely high degree of precision at the slit butting edges.

Synchrotron sources, effectively collimated, may be used to illuminate small scan width, W, with relative ease (perhaps as limited by fringing due to near-coherence—an effect sometimes suggesting deliberate modification to reduce the coherence). In general, small source area, such as in Lambertian as well as in collimated sources, is desirable. Power from larger area sources, e.g. plasma sources (both pinch plasmas and electron pumped plasmas) cannot be collected as efficiently as from a small source and requires relatively expensive, precisely designed condensers which increase both initial apparatus cost and processing cost (the latter to the extent to which condenser fabrication is imperfect).

An important aspect of the invention is directed to apparatus of design particularly suited to high throughput. This aspect of the invention is directed to all-reflective, reduction, ringfield projection apparatus designed for use in the wavelength range of from about 300 Å to 40 Å (within the so-called "long" or "soft" x-ray spectrum). While processes herein may make use of a broader class of apparatus designs, apparatus claimed is exemplary. Designs of the invention provide for throughput believed feasible for commercial manufacture while retaining advantages in terms of resolution and freedom from consequential aberrations previously associated with low throughput prior art apparatus.

In more specific terms, apparatus of the invention provides for the scanning arcuate slit-shape image field associated with earlier designs. Slit dimensions consistent with resolution/aberration needs may be of both length to accommodate pattern dimension without need for butting and width to make effective use of the x-ray source. Design options include substantial radial distance from the optical axis to permit large slit length (L)—length sufficient to permit single scan patterning of larger chips. For a preferred embodiment, this design flexibility translates into slit length (L) to match pattern width and substantial slit width (W) permitting effective use of a variety of x-ray sources, so resulting in high throughput. Large slit width also eases design requirements for providing uniform illumination over the entire slit.

In this invention a reflecting triplet aspheric mirror system is configured for use as reduction projection system in an unobscured ringfield form. (Avoiding central obscuration permits maximum contrast across the entire spatial frequency range—i.e. across the entire range of line spacing of image consequence). The basic conic constants for the mirrors are selected for each mirror to correct or balance spherical aberration, coma, astigmatism, and distortion. The mirror radii are selected for each mirror to act in concert with conic constants to provide optimal correction and to maintain an unobscured ringfield form which is telecentric in the image space. High order aspheric departures are also used to provide optimal diffraction limited performance. Preferred configuration in the design space have one of the three mirrors as a base sphere (i.e. conic constant of zero) with small sixth and eighth order aspheric departure. (Terminology with reference to the various forms of aberrations—coma, astigmatism, distortion—is in accordance with conventional usage. See, W. T. Welford, "Aberrations of the Symmetrical Optical System", Academic Press (1974)).

Systems of the invention use a fourth mirror (in prototypical systems, a folding mirror—of zero or finite optical power) between the second and third mirrors of the reflecting triplet. This fourth mirror serves four important purposes: (1) to fold the system—to place the wafer on the other side of the optics thereby permitting motion flexibility without obstruction; (2) to offer additional design flexibility in the optics to overcome other limitations of the triplet; (3) to increase clearance between optics and wafer and (4) to provide an accessible stop in the system. Increased slit width is ascribed, in significant part, to this design. An aspheric departure is added to this mirror, whether flat or curved, to provide additional correction of aberrations, resulting in a system whose usable field may be limited only by distortion. The imaging performance in terms of resolution (neglecting distortion) for this design form is limited by the residual field curvature resulting from the balance of its third and fifth orders. In a preferred configuration, the packaging mirror is spherical.

Description above is likely to be directly implemented in commercial apparatus, at least in initial designs. In fact, details set forth apply largely in historical sense in that most applicable prior work took the form of the triplet as modified by a planar folding mirror. While historically correct, it is apparent that certain of the functions of the fourth element may be assigned to member/s of the triplet. An optically equivalent system may be based on use of a folding mirror, perhaps spherical, containing no aspheric terms—a system in which the correction is made by appropriate aspheric correction to the other elements.

By the same token, although it is expected that a folding mirror will be used in most commercial apparatus, a simple triplet system may be designed to yield the increased W of the invention. It is conceivable that the advantage of reduced absorption loss could compensate for the convenience of the folding mirror.

It is convenient to set forth the attributes of the inventive system in terms of allowable features, both from the design and operational standpoint. In listing such features, it should be kept in mind that there are circumstances under which economics or other conditions may suggest omission of one or more.

Back clearance
Beam clearance at mirrors
Unobscured
Coaxial (all mirror centers of curvature and centers of ring-shaped object and image fields have common axis, which simplifies the system assembly and alignment)
Only conic plus 6th and 8th order departures (reduces aspheric mirror slope and thereby, fabrication complexity)
Aspheric departures are low
The reduction in usable field (required to maintain smear level) due to the here-observed radially-dependent and cross-scan distortions, is lessened, or even avoided by use of the distortion corrections of the inventions
One and sometimes two of the four mirrors are base spheres
Accessible aperture stop (folding mirror)

DETAILED DESCRIPTION

General Systems Characteristics

While four-mirror systems are preferred as being useful in terms of convenience, both in design and operation, optical objectives affording scan area/throughput are achievable in three-mirror (triplet) systems. Aspherics adequate for astigmatism nulling, consistent with other aberration lessening, are permitted in the triplet.

From a generic standpoint, innovative advances may be discussed on this basis. Design choices prominently depend on determination as to whether there is an intermediate image (whether there is re-imaging) and whether the initial mirro (that closest to the object) will be positive (concave) or negative (convex). Generally there is a performance penalty associated with re-imaging in that attainment of high resolution (as contemplated for devices herein) is made difficult. Since re-imaging is not required for contemplated device fabrication, re-imaging was not provided for.

Often for large format systems, a negative first mirror is used to reduce the effective field of view delivered to the following mirrors. This design option was pursued but it was found that the telecentric requirement in unobscured configuration could not be met. As a result, preferred systems of the invention depend upon a positive first mirror. Telecentricity, a desired property of systems/processes herein, is descriptive of the normal incidence of image-forming rays with respect to the focal plane (e.g. with respect to the wafer). It is of primary value in permitting slight movement of the wafer to a position outside of the focal plane without resulting in image deterioration due to image shifting (attendant upon non-normal angle of incidence) and/or to change in image magnification for chief rays which are nonparallel.

The above information was input to a computer using a lens design program to yield the design information described in the Examples—e.g. that of Tables I-IV. The particular program used was "Code V" TM offered by Optical Research Associates (ORA) although a variety of programs of similar capability are available and may be used.

Exemplary Preferred Embodiments

In a working embodiment the projection system comprises, from object plane to image plane, a first concave, a second convex, a third concave, and a fourth concave mirror. To obtain an extremely low distortion (~10 nm) over the ring field, at least two of these mirrors have to be aspherics. The radii absolute values of the four mirrors are, again from object to image and as a fraction of the system focal length, 0.56, 0.22, 4.57 and 0.38, all to within ±5%. Equivalently, the radii of the four mirrors are, in the same order, in the ratio of 1.00, 0.397, 8.165 and 0.688, all to with ±5%. The axial separation of the mirrors, as a fraction of the system focal length, are 0.191 (first concave to second convex), 0.165 (second convex to third concave), 0.197 (third concave to fourth concave), and 0.286 (fourth concave mirror to the image), all within ±10%. The numerical aperture of the system at the image is 0.1 and can be reduced if high resolution of 0.08 μm is not needed. The numerical aperture can be increased to ~0.14 without significant loss in the image quality (still diffraction limited performance), if the image distortion requirement is relaxed.

Figure 4:
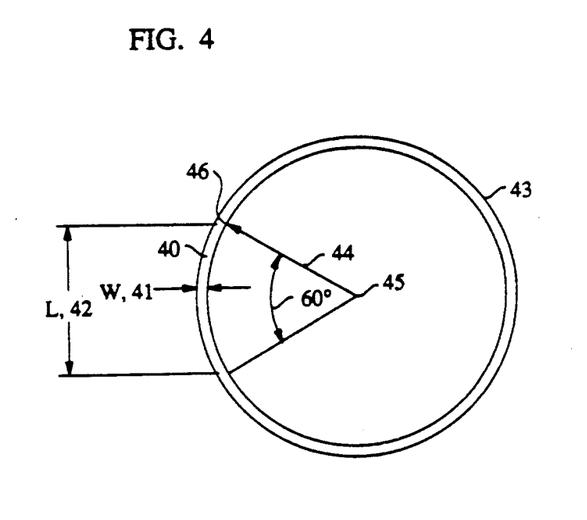
FIG. 4 shows the image field shape and size of an exemplary inventive projection system.

In preferred embodiments the usable image field (based on imaging performance and neglecting distortion) has shape of the arc with two dimensions R and W, where R is the radius of the arc and W is the width of the arc as shown in FIG. 4 (R>W), and W>1 mm. This system is compact with the back clearance (necessary for system implementation in vacuum environment) of at least 2 inches. Since astigmatism is corrected over large ring width, usable ring width for x-ray lithographic application for contemplated design rules is limited by distortion. This is of particular significance for design rules of 0.1 μm and smaller at which there is little expected competition by use of delineating radiation in the UV spectrum. Other considerations, e.g. yield, might well result in commercial adaptation for larger design rules as well—for design rules as large as ≈0.3 μm.

Scanning systems, by their nature, impose stringent requirements on constancy of the demagnification of any point on the mask onto its corresponding point on the wafer. The demagnification for a particular point on the mask is determined by a combination of the paraxial demagnification of the optical system and the distortion. In terms of the ringfield scan system, a single point on the mask passes along a line path in the arcuate illuminated field of the optical system while being imaged to a single point on the wafer. The exact position of this optically projected point on the wafer will vary if the local demagnification varies along this scan path which results in mage smear. The variation in local demagnification-induced image smear is often the controlling factor in acuity. Along the direction of scan, a constant or linear variation in local distortion (and, therefore, local demagnification) can be compensated for, through fine adjustment of the wafer scan rate to be slightly different than the paraxial value for the reduction ratio. In the cross-scan direction, however, this technique is ineffective for features that lie azimuthally away from the center of the illuminated arcuate ring. Any change in local magnification due to distortion variation radially across the ring will cause cross-scan image smear that cannot be compensated.

The above observation was verified by use of a model in which the object (the mask) was decentered together with the image (the wafer)—decentering of the image was at the distance equal to the product of the reduction ratio and the object displacement. Modeling entailed a set of seven object points at 10° increments along the top of the ring slit. The x and y intercepts of the chief ray at the image for a set of five scan positions are shown in Table A. From the table it is seen that y direction scanning produces 11 nm image smear in the x direction at the edges of the ±30 degrees arc length of the slit.

TABLE A

| SCANNED MAPPING EVALUATION | | | | | | |
|---|---|---|---|---|---|---|
| −30 | −20 | −10 | 0 | 10 | 20 | 30 |
| Y-INTERCEPT VERSUS RING WIDTH OUTER TO INNER EDGE (MM) | | | | | | |
| −27.279815 | −29.600334 | −31.021461 | −31.500017 | −31.021461 | −29.600334 | −27.279815 |
| −27.279807 | −29.600325 | −31.021451 | −31.500007 | −31.021451 | −29.600325 | −27.279807 |
| −27.279802 | −29.600319 | −31.021445 | −31.500000 | −31.021445 | −29.600319 | −27.279801 |
| −27.279798 | −29.600315 | −31.021441 | −31.499997 | −31.021441 | −29.600315 | −27.279798 |
| −27.279797 | −29.600314 | −31.021441 | −31.499997 | −31.021441 | −29.600314 | −27.279797 |
| X-INTERCEPT VERSUS RING WIDTH OUTER TO INNER EDGE (MM) | | | | | | |

TABLE A-continued

| | | SCANNED MAPPING EVALUATION | | | | |
|---|---|---|---|---|---|---|
| −30 | −20 | −10 | 0 | 10 | 20 | 30 |
| 15.750009 | 10.773460 | 5.469921 | 0.000000 | −5.469921 | −10.773640 | −15.750009 |
| 15.750004 | 10.773637 | 5.469919 | 0.000000 | −5.469919 | −10.773637 | −15.750004 |
| 15.750001 | 10.773635 | 5.469918 | 0.000000 | −5.469918 | −10.773635 | −15.750001 |
| 15.749999 | 10.773634 | 5.469917 | 0.000000 | −5.469917 | −10.773634 | −15.749999 |
| 15.749998 | 10.773633 | 5.469917 | 0.000000 | −5.469917 | −10.773633 | −15.749998 |

In prior art ringfield systems the ring widths typically would be limited by astigmatism before they were limited by distortion, although at these distortion levels (i.e. 10 nm) there has been very little work done. The resolution over this image field is 0.08 μm.

The following table, Table B, describes performance data in terms of resolution across the field width of the slit. It shows the 84% encircled energy diffraction spot diameter, and the RMS wavefront error at wavelength of 13 nm.

TABLE B

| Image Height (mm) | 84% Encircled Diffraction Spot Size (Microns) | RMS Wavefront Error Waves at 13 nm |
|---|---|---|
| 31.000 | 0.20 | 0.034 |
| 31.125 | 0.19 | 0.027 |
| 31.250 | 0.19 | 0.026 |
| 31.375 | 0.20 | 0.030 |
| 31.500 | 0.20 | 0.037 |

In particularly preferred embodiments of the invention, the image reduction is at least 2:1, W is at least 0.5 mm, R is at least 31.25 mm, and the resolution over the ring-shaped image field is higher than 0.1 μm. If such resolution is not required, it may be reduced (e.g. to a value in the range of from 0.2 μm–0.5 μm) simply by reducing the aperture in the system to permit an increase in the ring width, and, consequently, in increased throughput. The aperture stop in preferred embodiment of the invention is near the tertiary mirror.

DETAILED DESCRIPTION OF SOME EXEMPLARY PREFERRED EMBODIMENTS

Figure 1:
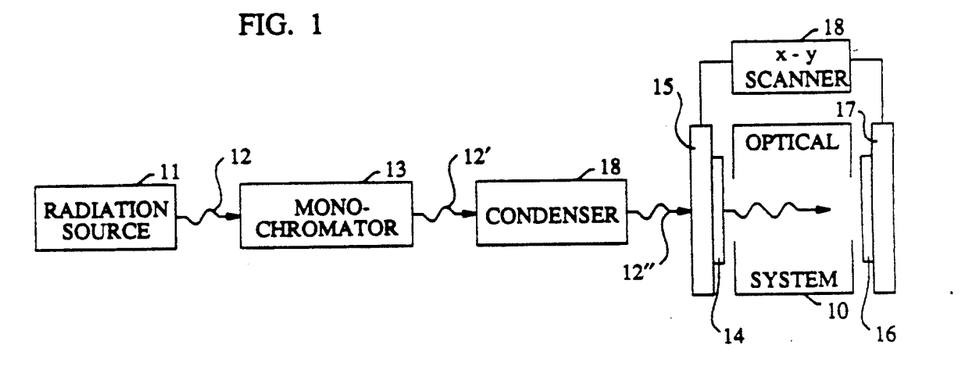
FIG. 1 schematically depicts the main elements of exemplary x-ray lithography apparatus according to the invention.

FIG. 1 schematically depicts exemplary inventive apparatus for semiconductor x-ray lithography. The apparatus comprises a radiation source 11 (exemplarily a synchrontron or a laser plasma source) that emits x-ray beam 12, typically a polychromatic beam. Optional filtering system 13 serves to narrow the spectral width of the beam 12 such that a substantially monochromatic beam 12' results. Such beam is next introduced into condenser 18 which emits a beam 12" of configuration to uniformly illuminate the requisite portion of mask 14. The emerging patterned beam is introduced into the optical system 10, which projects an image of mask 14, shown mounted on mask stage 15, onto wafer 16 which is in turn mounted on stage 17. Element 18, an x-y scanner, scans mask 14 and wafer 16 in such direction and at such relative speed as to accommodate the desired mask-to-image reduction. Since, as will be discussed below, the inventive projection system is an all-reflective system, use of a filtering system may not always be necessary. However, best resolution will generally be obtained if longer wavelengths are removed from the beam. Furthermore, by matching the spectral width of the incident radiation to the reflectivity bandwidth of the mirrors in the projection system, the stability of the system will typically be enhanced, since the mirrors will not have to carry the load of unwanted radiation.

Figure 2:
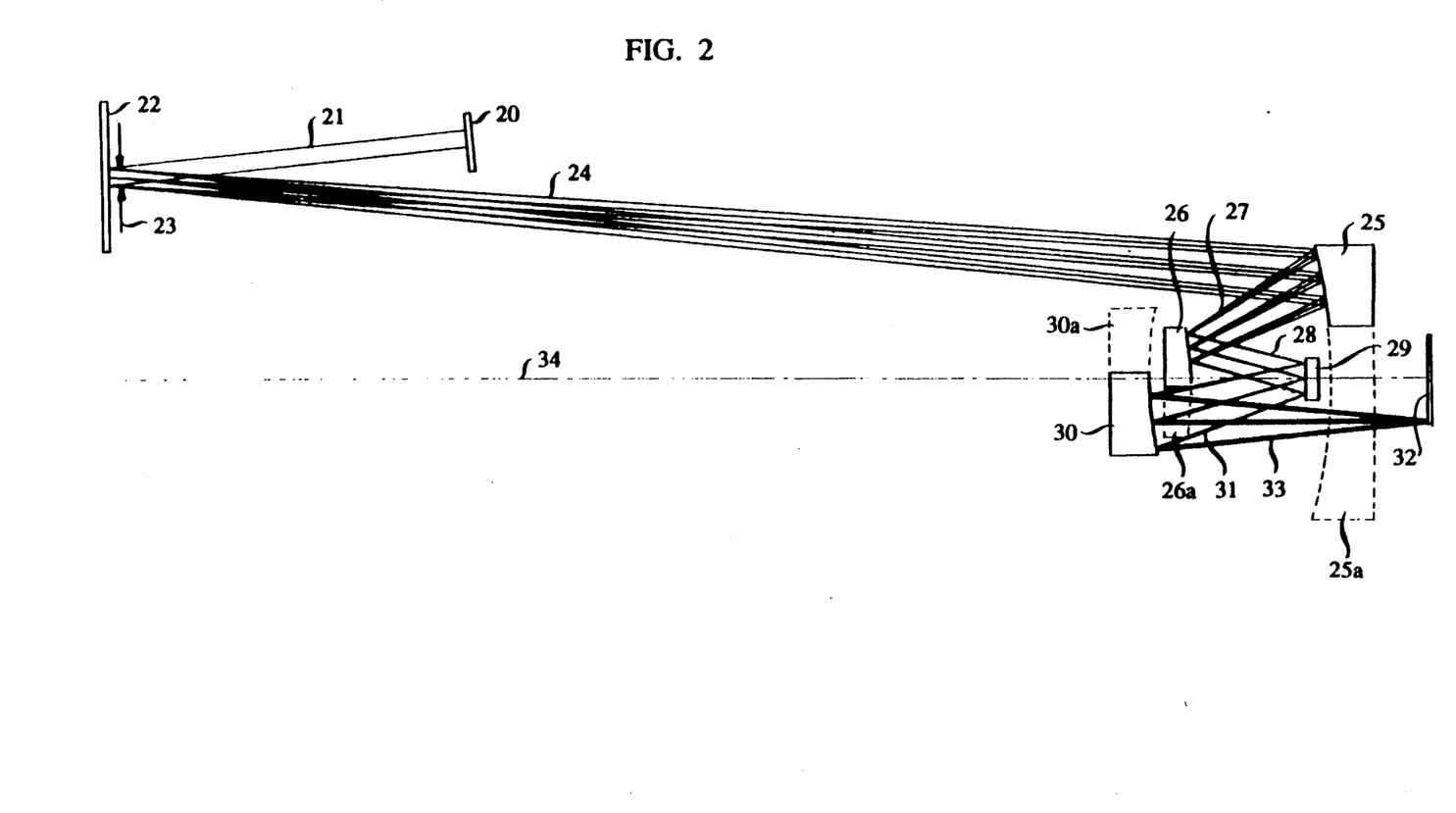
FIG. 2 and 3 schematically show, in side view and top view, respectively, the relevant parts of an exemplary inventive projection system from mask to image plane; off-axis portions of parent rotationally symmetric mirrors are shown.
Figure 3:
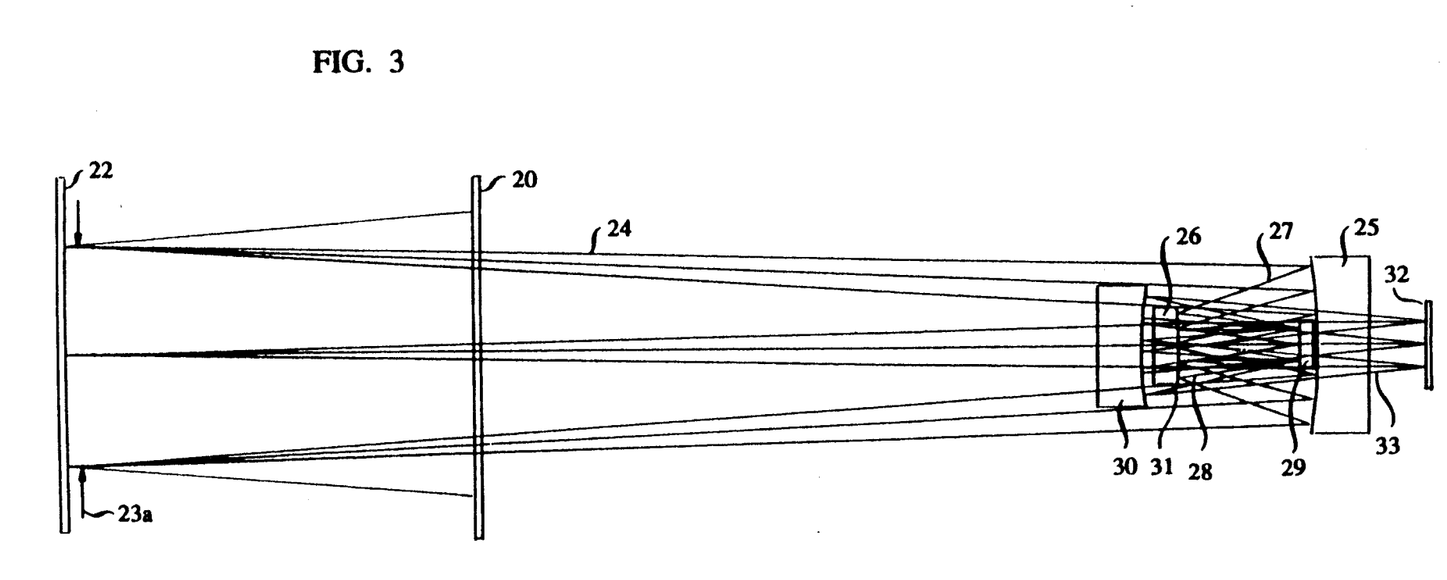

FIGS. 2 and 3 depict a schematic representation of an apparatus as used in development reported in the example. The two figures are 90° views of the same apparatus. Such apparatus, depicted in operation consists of x-ray source 20 producing beam 21, in turn illuminating mask 22 (corresponding with mask 14 of FIG. 1) over slit width, W, 23. The figures are simplified schematic representations so that, for example, the x-ray beam shown as emanating from source 20 is, in the usual instance, the consequence of a condenser intermediate source 20 and mask 22 not shown. Reflected beam 24, shown as diverging, is reflected by concave mirror 25 so as to illuminate convex mirror 26 with now converging beam 27. Reflection from convex mirror 26 results in beam 28, illuminating folding mirror 29, which in the instance shown, is concave to result in illumination of concave mirror 30 by now diverging beam 31. Curvature and location of mirror 30 is such as to result in reflected radiation which is telecentric in image space. Illumination of wafer 32 by beam 33 is shown converging so as to represent such image reduction relative to mask 22 as provided for. For tutorial purposes, completed coaxial structures of which mirrors 25, 26 and 30 are a part, are shown with broken line portions 25a, 26a and 30, completing such structures—all shown as coaxial relative to axis 34. Folding mirror 29 is shown centrally disposed with reference to axis 34—an arrangement as actually used in the example. Ring-shaped object and image fields are coaxial with reference to axis 34 and their planes (i.e. the object/image planes containing the arcuate fields) are normal to axis 34.

FIG. 3 depicts the apparatus of FIG. 2 as viewed at right angles to the representation of the earlier figure. Source 20 again illuminates mask 22, this time with imaging radiation 23a of major dimension sufficient for illumination of the slit—to uniformly illuminate the slit in its major dimension, length, L. The remainder is as shown in FIG. 2: beam 24 is reflected by mirror 25 to illuminate mirror 26 with beam 27 resulting in illumination of folding mirror 29 by beam 28. This in turn results in beam 31 which illuminates mirror 30 to produce focused image on wafer 32 by means of beam 33.

In operation, the light beam 24 emanating from various points on the mask 22 is reflected in converging pattern by the primary mirror 25, a concave aspheric, onto secondary mirror 26, a convex aspheric. The radiation 27 received by the secondary mirror 26 is reflected as radiation 28 on the concave surface of tertiary mirror 29. In the currently preferred embodiment the tertiary mirror is a quasi-flat weak aspheric, but optionally could be spherical. The tertiary mirror 29 is located at the aperture stop of the system—at the position at which principal rays cross, and serves to fold, i.e. to move the image to the other side of the optics. Like other of the optic elements it is centered with respect to optic axis 34. The power added to this mirror is required to provide the back clearance necessary for the projection lithography application. From the tertiary mirror the radiation is reflected in a diverging pattern upon quaternary mirror, a concave aspheric. The curvature and location of this mirror are chosen such that radiation reflected off it is telecentric in the image space. As shown, the inventive exposure system is rotationally symmetric in the aperture and the ring-shaped object and the image fields and both object and image planes are normal to optic axis 34. Furthermore, it is an all reflective, reduction, unobscured, finite conjugate system adapted to form a flat arc-shaped x-ray image of a flat mask. The image can be diffraction-limited, with high resolution over the image field. The image field has shape of the arc with dimensions W and L, where W is the arc width and L is the arc length. The arc length L depends on the ring radius R and may be defined as shown in FIG. 4.

FIG. 4 is a schematic representation showing slit 40 of dimensions, W, 41 and length, L, 42, depicted as a portion of ringfield 43 defined by radial dimension, R, 44 spanning the distance from optic axis 45 and the center 46 of slit 40. Exemplarily, W is about 0.5 mm and R is about 31.25 mm, which makes L about 31.25 mm. However, rectangular, square or other off-axis field shapes are also possible and are contemplated. Both conic and general aspheric mirror geometries may be utilized in various embodiments which are made possible by the invention. The invention also provides an optical system which may attain various levels of image quality, typically in the range of 0.5 μm to 0.05 μm, and distortion correction from 1 μm to 0.001 μm.

In projection systems according to the invention the mirror parameters can readily be chosen to cooperate to give a high degree of correction of spherical aberration, coma and Petzval curvature. Features of the design include: an accessible stop (at or near the tertiary mirror); low distortion, e.g. resulting in less than 11 nm image smear in the cross-scan direction; telecentric image space (non-telecentricity error is less than 5 nm per 1 μm defocus), i.e. as normalized per micrometer displacement of the image plane from the focal plane; and large back clearance, e.g. more than 2 inches, through the addition of a packaging fold and the use of power of the added mirror to control the packaging clearance.

Typically, the resolution over the image field is better than 0.2 μm in the inventive systems. In an exemplary system according to the invention the resolution is 0.08 μm over a ring field of 0.5 mm in width and 31.25 mm of its radius.

Table B shows calculated performance data for the currently preferred embodiment of the inventive projection system, for wavelength of 13 nm. In particular, Table B shows the 84% encircled energy diffraction spot diameter, and RMS wavefront error for different field points across 0.5 mm ring width.

Tables I-III contain constructional data and other relevant information for the exemplary currently preferred projection system of FIGS. 2 and 3. This system is a 4:1, 0.1 NA, 0.5 mm telecentric ring field system. The reference wavelength is 13 nm.

Table I shows mirror radii and spacings, and taken together with Tables II-III, describes the apparatus of the Example. Quantities set forth are in terms well-known to those conversant with optical design as described, for example, in ORA Code V Reference Manual, Version 7.20 (December 1988), Optical Research Associates, Pasadena, Calif.

Terms of art include: "INF" (descriptive of a flat, of a peripheral surface of a circle of infinite radius); "Thickness" is the art-approved term for surface-to-surface distance so that e.g. 571.7951 is the distance in mm from the Object surface to the first mirror.

TABLE I

| | Fabrication Data | |
|---|---|---|
| Element Number | Radius of Curvature | Thickness |
| Object | INF | 571.7951 |
| 1 | A(1) | −179.0230 |
| 2 | A(2) | 155.2065 |
| | | APERTURE STOP |
| 3 | A(3) | −183.9781 |
| 4 | A(4) | 267.7691 |
| Image | INF | |

Asphericity values, A(1)–A(4) are set forth in Table II.

TABLE II

Aspheric Constants $$Z = \frac{(CURV)Y^2}{1 + (1 - (1 + K)(CURV)^2 Y^2)^{\frac{1}{2}}} + (A)Y^4 + (B)Y^6 + (C)Y^8 + (D)Y^{10}$$

| ASPHERIC | CURV | K | A | B | C | D |
|---|---|---|---|---|---|---|
| A(1) | −0.00190951 | −0.077053 | 0.00000E+00 | −2.46937E−15 | −6.20497E−20 | 0.00000E+00 |
| A(2) | −0.00480913 | 0.715402 | 0.00000E+00 | 5.09540E−13 | −1.67291E−16 | 0.00000E+00 |
| A(3) | −0.00023389 | 0.000000 | 5.10668E−09 | 2.45781E−113 | −3.94080E−16 | 0.00000E+00 |
| A(4) | 0.00277481 | 0.289531 | 0.00000E+00 | 1.09237E−15 | 7.89267E−20 | 0.00000E+00 |

Table III gives first order data on the exemplary system.

TABLE III

| System Characteristics | | |
|---|---|---|
| EFL | = | 936.2025 |
| Reduction | = | 0.2500 |
| Finite F/NO | = | 5.0000 |
| Total Track | = | 631.7951 |
| Paraxial | | |
| Image HT | = | 31.5000 |
| Image Dist | = | 59.9746 |

Preceding description under "Example", including Tables A, B and I-III relate to an actual working embodiment of the invention. While such matter is included for the sake of completeness, it does not set limits on the inventive teaching which is properly described in the claims.

Processing Considerations

Detailed description thus far is largely in apparatus terms, although processing implications have not been ignored. Clearly, flexibility in slit dimensions is of paramount value. Increased slit width over which relevant aberration is reduced permits throughput advantage for submicron devices under fabrication. As noted, this, in turn, may translate into increased slit length to permit expedient fabrication of larger chips and to reduce overhead. Apparatus design presented has been somewhat restrictive. The now recognized capability of aberration reduction over greater width will give rise to other design approaches—approaches outside the category presented. Activity in this direction will be provoked by inherent processing advantages.

X-ray lithographic patterning—to some extent soft x-ray in particular—presents inherent advantages for the contemplated design rule range of 0.25 μm and below. An exciting ongoing development relating to high resolution resist has taken the form: first of multilevel resists (in which only the top level is exposed and developed, subsequently to have its pattern transferred to underlying material) and; second of surface activation resist—itself initially in the form of "near-surface" activation and finally of true-surface activation. In near-surface activation conditions/materials are so chosen as to resist penetration of image forming radiation to the top region—a region of perhaps 2,000 or 3,000 Å in thickness. True surface activation, a recent emerging field, involves activation through a thickness of only one or a few monolayers on the free surface.

Near-surface and true-surface activation have, to this time, required activity directed toward deliberate increase in opacity to restrict penetration of patterning radiation. The soft x-ray range primarily addressed in this disclosure is inherently suited to these approaches. For example, the 130 Å radiation treated in many considerations above, has an inherently limited penetration depth in most real materials. Organic resist materials otherwise suitable are penetrated only to depth to the order of a few thousand Å. Other resist materials, containing heavier elements further reduce depth of penetration.

Advantages of surface and near-surface activation—advantages which have provoked deliberate effort toward increasing opacity in the UV wavelengths—advantages of particular significance for small design rules contemplated—all lead to reliable attainment of high resolution. Depth of but a few thousand Å allow more flexibility for x-ray processing in which depth of focus may be 1 μm or less. Transfer procedures by which the image involved in surface activation is transferred to underlying material, show promise of near-perpendicular patterning—of anisotropic transfer to minimize undercutting.

While apparatus/processing of the invention contemplates shorter wavelength, e.g. down to ~55 Å, most significant commercial usage may in fact entail use of the longer wavelengths contemplated. Initial usage, in permitting uniform composition single-material resist layers of the needed ~1 μm thickness is expected to command attention. Use of 55 Å radiation, which may penetrate through the entirety of a resist layer (likely in the 0.5–1.0 μm thickness range) permits resist/development in the usual commercial manner, with well-understood economy implications (reduction in required processing steps, higher expected yield, etc.). It is likely, however, that consideration set forth above will lead to emphasis on surface activation. For detailed discussion of the foregoing, see *Proceedings of SPIE*, vol. 1343, (1990), "Resist Schemes For Soft X-ray Lithography" (presented at Symposium on XUV Lithography, San Diego, Calif., Jul. 9–12, 1990).

The inventive advance is of greatest significance in offering economically feasible fabrication throughput to compete or exceed that of alternative approaches. Processes of the invention, utilizing available x-ray sources, permit pattern exposure at a rate of 1 cm$^2$ per second and above. This is equivalent to writing a six inch wafer in three minutes. Assuming one minute overhead time (for wafer transport and alignment) this results in a throughput of 15 six inch diameter wafers per hour. Exposure at a rate of 0.5 cm$^2$/sec with the same overhead time results in a throughput of 8 wafers per hour—still an acceptable throughput.

Work to date suggests resist sensitivity in the range of from 5–10 mj/cm$^2$ (millijoules/square centimeter) as a compromise between throughput and resolution. Resists of greater sensitivity, e.g. at or below 1 mj/cm$^2$ may suffer from degraded resolution due to statistical fluctuations in the number of x-ray photons absorbed.

If one square centimeter per second is to be exposed, it is necessary to deliver 10 mW of the x-ray power to the wafer. Projection systems such as those described, containing four mirrors and a reflective mask result in source-to-image transmission efficiency of about 7.8% on the assumption that each surface has a reflectivity of about 60% at normal incidence. This translates into a power requirement of about 130 mW incident on the mask. Usable radiation bandwidth is largely a function of the bandwidth of reflectivity of condenser and mirrors. Bragg mirrors and condenser designs thus far studied are based on a bandwidth of 5% about a center wavelength value of 130 Å (a suitable wavelength for use with molybdenum-silicon multi-layer DBR coatings). Such radiation is obtainable from a bending magnet of a large synchrotron (The National Synchrotron Light Source Vacuum Ultraviolet Ring at the Brookhaven Laboratories produces 0.25 mW at a bandwidth of 1%/milliradian/100 mA).

If condenser optics can collect 50% of this power within 100 millirad of divergence angle when the storage ring has 300 mA of current, there will be ≈170 mW of power falling on the mask within 5% of wavelength bandwidth centered about 130 Å, to yield an excess of the required 130 mW for mask illumination.

For further details, see "Soft X-ray Projection Lithography" by D. L. White et al, *Solid State Technology* (July 1991).

We claim:

1. Scanning ringfield reduction projection apparatus for lithographic patterning with x-ray radiation in the wavelength range of from 300 Å to 40 Å, the optics of the apparatus being all-reflective and comprising Distributed Bragg Reflectors, characterized in that the apparatus includes a scanning arcuate slit of constant radius from the optic axis along its length and of width in the scanning direction of at least 0.5 mm, the focusing optics consisting of four coaxial, spherical elements, which as viewed from object to image are, in succession, concave, convex, concave and concave, the third element providing an accessible stop, at least two elements having aspheric departures, and all elements being coaxial.

2. Apparatus of claim 1 in which the width of the slit decreases from a central maximum value to compensate for otherwise-increased curvature-induced exposure.

* * * * *